(12) United States Patent
Ohki et al.

(10) Patent No.: US 10,681,808 B2
(45) Date of Patent: *Jun. 9, 2020

(54) METAL-BASE PRINTED CIRCUIT BOARD

(71) Applicants: Waseda University, Tokyo (JP); Fuji Electric Co., Ltd., Kanagawa (JP)

(72) Inventors: Yoshimichi Ohki, Tokyo (JP); Yuichi Hirose, Tokyo (JP); Genta Wada, Tokyo (JP); Toshikatsu Tanaka, Tokyo (JP); Kenji Okamoto, Kanagawa (JP)

(73) Assignees: Waseda University (JP); Fuji Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/354,668

(22) Filed: Nov. 17, 2016

(65) Prior Publication Data

US 2017/0127514 A1 May 4, 2017

Related U.S. Application Data

(63) Continuation of application No. 14/398,616, filed as application No. PCT/JP2013/070897 on Aug. 1, 2013, now Pat. No. 9,554,464.

(30) Foreign Application Priority Data

Aug. 2, 2012 (JP) ................................ 2012-171890

(51) Int. Cl.
*H05K 1/05* (2006.01)
*C09D 163/00* (2006.01)
(Continued)

(52) U.S. Cl.
CPC .............. *H05K 1/056* (2013.01); *C09D 7/67* (2018.01); *C09D 7/68* (2018.01); *C09D 7/69* (2018.01);
(Continued)

(58) Field of Classification Search
CPC ............................................. H05K 2201/0209
See application file for complete search history.

(56) References Cited

U.S. PATENT DOCUMENTS

2005/0154092 A1* 7/2005 Liu .......................... C08K 3/08
523/458
2006/0043382 A1* 3/2006 Matsui ................ H01L 25/0753
257/79
(Continued)

FOREIGN PATENT DOCUMENTS

JP          06318770        11/1994
JP          07135380         5/1995
(Continued)

OTHER PUBLICATIONS

International Search Report for Application No. PCT/JP2013/070897 dated Oct. 8, 2013.

*Primary Examiner* — Ian A Rummel
(74) *Attorney, Agent, or Firm* — Lerner, David, Littenberg, Krumholz & Mentlik, LLP

(57) ABSTRACT

A highly thermally conductive printed circuit board prevents electrochemical migration by inhibiting elution of copper ions. The printed circuit board is a metal-base printed circuit board including a metal base plate having an insulating resin layer and a copper foil layer stacked thereon in this order. In the printed circuit board, the insulating resin layer contains a first inorganic filler made of inorganic particles having particle diameters of 0.1 nm to 600 nm with an average particle diameter ($D_{50}$) of 1 nm to 300 nm, and a second inorganic filler made of inorganic particles having particle diameters of 100 nm to 100 μm with an average particle diameter ($D_{50}$) of 500 nm to 20 μm, and the first inorganic filler and the second inorganic filler are uniformly dispersed in the insulating resin layer.

20 Claims, 4 Drawing Sheets

(51) Int. Cl.
  *H05K 1/03*    (2006.01)
  *H05K 1/09*    (2006.01)
  *H05K 1/02*    (2006.01)
  *C09D 7/40*    (2018.01)

(52) U.S. Cl.
  CPC .......... *C09D 163/00* (2013.01); *H05K 1/0201* (2013.01); *H05K 1/0373* (2013.01); *H05K 1/09* (2013.01); *H05K 1/0204* (2013.01); *H05K 1/0256* (2013.01); *H05K 2201/0209* (2013.01); *H05K 2201/0266* (2013.01); *H05K 2201/0769* (2013.01); *H05K 2201/10106* (2013.01); *Y10T 428/24893* (2015.01)

(56) References Cited

U.S. PATENT DOCUMENTS

2007/0232727 A1\* 10/2007 Lin ..................... B82Y 30/00
                                                        523/440
2010/0006334 A1   1/2010 Takenaka et al.
2010/0096173 A1\* 4/2010 Fujino ..................... C08G 59/50
                                                        174/258
2012/0067631 A1\* 3/2012 Kusukawa ............ H01L 23/142
                                                        174/258
2012/0111621 A1\* 5/2012 Ohigashi ................ B32B 15/08
                                                        174/258
2012/0189826 A1   7/2012 Hayashi
2012/0193131 A1   8/2012 Kusakawa et al.

FOREIGN PATENT DOCUMENTS

| | | |
|---|---|---|
| JP | 2003133664 A | 5/2003 |
| JP | 2007153969 A | 6/2007 |
| JP | 2007270151 A | 10/2007 |
| JP | 2009274929 A | 11/2009 |
| JP | 2010205955 A | 9/2010 |
| JP | 2011077270 A | 4/2011 |
| WO | 2010117023 A1 | 10/2010 |

\* cited by examiner

METAL-BASE PRINTED CIRCUIT BOARD

CROSS-REFERENCE TO RELATED APPLICATIONS

This application is a continuation of U.S. patent application Ser. No. 14/398,616, filed on Nov. 3, 2014, which is a national phase entry under 35 U.S.C. § 371 of International Application No. PCT/JP2013/070897 filed Aug. 1, 2013, published in Japanese, which claims priority from Japanese Patent Application No. 2012-171890 filed Aug. 2, 2012.

TECHNICAL FIELD

The present invention relates to a metal-base printed circuit board in which electrochemical migration can be prevented from occurring.

BACKGROUND ART

Printed circuit boards are necessary as components for electronic apparatuses and electrical apparatuses. Printed circuit boards have various structures such as single-sided printed circuit boards, double-sided printed circuit boards, and multilayer printed circuit boards. Printed circuit boards are assembled by mounting devices such as resistors, capacitors, reactors, and transformers, by soldering.

Recently, to dissipate heat generated when power semiconductors or LED devices are operated, metal-base printed circuit boards including a copper foil layer, an insulating resin layer, and a metal base plate have been increasingly used. To conserve energy, power semiconductors that control electric power, and LEDs that can emit light with less electricity than incandescent light bulbs, have been increasingly employed.

For example, a metal-base printed circuit board has a structure in which an insulating resin layer having a thickness of approximately 100 μm to approximately 300 μm and a copper foil layer having a thickness of approximately 35 μm to approximately 140 μm are stacked in this order on a metal base plate having a thickness of approximately 1 mm to approximately 2 mm.

The insulating resin layer is obtained as a prepreg having a thickness of about 50 μm by applying a material obtained by adding an inorganic filler such as $SiO_2$ or $Al_2O_3$ to an epoxy resin onto a copper foil layer, a PET film, or the like. One to several sheets of the prepreg are stacked on the metal base plate, and furthermore, the copper foil layer is stacked thereon. Then, these layers and plate are bonded together by hot pressing. A metal-base printed circuit board is obtained by etching the copper foil layer to any wiring pattern. As the metal-base printed circuit board, a printed circuit board described in Patent Document 1 is known, for example.

A point in a case in which a power semiconductor or the like is mounted on a metal-base printed circuit board is that the metal-base printed circuit board can dissipate heat (cool the power semiconductor or the like) appropriately during the operation thereof. As the power semiconductor, an insulated gate bipolar transistor (IGBT), a MOS-FET (metal oxide film semiconductor field-effect transistor), or the like is used. The electric power generated by the power semiconductor reaches several watts to several tens of watts. To dissipate the heat efficiently, it is desirable that the insulating resin layer have as high a thermal conductivity as possible.

Insulating resin layers generally used so far for metal-base printed circuit boards have thermal conductivities of about 1 W/m·K to 3 W/m·K. Recently, those having higher thermal conductivities have been demanded, and insulating resin layers having thermal conductivities improved to about 5 W/m·K to 6 W/m·K have been developed and used.

In the case of a metal-base printed circuit board with the thermal conductivity being about 1 W/m·K to 3 W/m·K, an inorganic filler such as $SiO_2$ or $Al_2O_3$ is added at a ratio of about 80% by mass. To increase the thermal conductivity to about 5 W/m·K to 6 W/m·K, $Al_2O_3$ or the like is further added to about 80% by mass to 95% by mass, or an inorganic filler having a high thermal conductivity such as BN or AlN is added.

In general, the insulating resin layer used has a thickness of 80 μm to 200 μm. A voltage is to be applied between the copper foil layer and the metal base plate. The applied voltage varies depending on the purpose of the device, and for example, when a 1200 V IGBT element is used, a voltage of approximately 1000 V is applied to the insulating resin layer. Hence, the insulating resin layer has to provide reliable insulation for a long period.

In particular, it is necessary to prevent occurrence of electrochemical migration, which is one of the insulation degradation phenomena occurring in the wiring pattern of the copper foil layer. In this phenomenon, moisture absorption or dew condensation, which may occur during use of the device, causes decrease in insulation resistance in the wiring pattern of the copper foil layer, and copper ions are eluted from the copper foil and are deposited by reduction on the counter electrode, so that an electrically conductive path is formed, which leads to a short circuit.

The electrochemical migration may also occur in an insulating resin layer of a metal-base printed circuit board. Hence, it is necessary to prevent the electrochemical migration. In particular, copper ions are easily eluted in end portions of the copper foil layer and in the vicinities of the end portions where the electric field intensity is high.

PRIOR ART DOCUMENTS

Patent Documents

[Patent Document 1] Japanese Patent Application Publication No. Hei 6-318770

SUMMARY OF INVENTION

Technical Problems

To prevent the electrochemical migration, several factors must be inhibited. It is particularly important that copper ions should not be eluted from the copper foil layer into the insulating resin layer. In this respect, in general, ionic components in the insulating resin layer are reduced to prevent copper ions themselves from being eluted from the copper foil layer or the like. Alternatively, a method is attempted in which the migration of copper ions is inhibited by increasing the cross-linking density of the resin forming the insulating resin layer.

However, all of these methods require modification by repeated examination of the material itself, and it is therefore difficult to carry out.

In view of the above-described circumstances, an object of the present invention is to provide a printed circuit board excellent in electrochemical migration resistance.

Solution to Problems

The present inventors have found that when the insulating resin layer is formed from a material obtained by adding a nano-sized inorganic filler to a resin, the migration of copper ions themselves into the insulating resin layer, i.e., the elution of copper ions, can be inhibited. As a result, the present inventors have completed the present invention.

To achieve the above-described object, a mode according to the present invention is a metal-base printed circuit board comprising a metal base plate having an insulating resin layer and a copper foil layer stacked thereon, in this order, wherein the insulating resin layer comprises a first inorganic filler made of inorganic particles having particle diameters of 0.1 nm to 600 nm with an average particle diameter ($D_{50}$) of 1 nm to 300 nm, and a second inorganic filler made of inorganic particles having particle diameters of 100 nm to 100 µm with an average particle diameter ($D_{50}$) of 500 nm to 20 µm, and the first inorganic filler and the second inorganic filler are uniformly dispersed in the insulating resin layer.

Advantageous Effects of Invention

The present invention makes it possible to provide a metal-base printed circuit board in which the elution of copper ions from a copper foil layer to an insulating resin layer can be inhibited, and the electrochemical migration can consequently be prevented from occurring.

DESCRIPTION OF EMBODIMENTS

Figure 1:
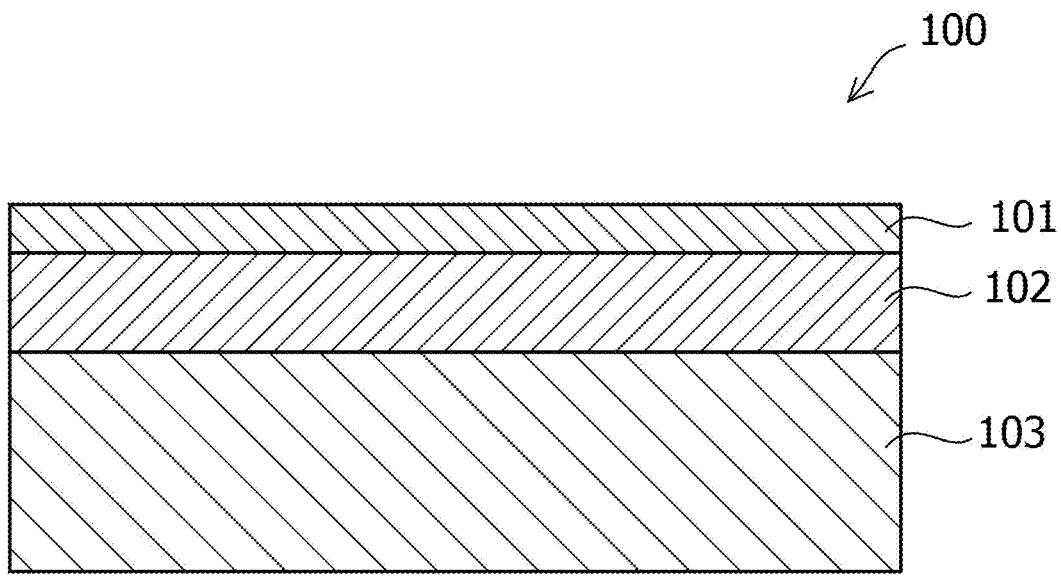
FIG. 1 is a cross-sectional view illustrating a structure of a metal-base printed circuit board according to an embodiment of the present invention.

Hereinafter, an embodiment of the present invention will be described. However, the present invention is not limited to the embodiment described below.

A metal-base printed circuit board of the present invention basically includes an insulating resin layer, a copper foil layer, and a metal base plate. The insulating resin layer and the copper foil layer are stacked in this order on the metal base plate. In the metal-base printed circuit board, the metal base plate has a thickness of 100 µm to 2 mm, the insulating resin layer has a thickness of 100 µm to 300 µm, and the copper foil layer has a thickness of 9 µm to 140 µm, in general. As the metal base plate, a metal base plate made of aluminum, copper, iron, or the like can be used.

The insulating resin layer comprises a first inorganic filler made of inorganic particles having particle diameters of 0.1 nm to 600 nm with an average particle diameter ($D_{50}$) of 1 nm to 300 nm and a second inorganic filler made of inorganic particles having particle diameters of 100 nm to 100 µm with an average particle diameter ($D_{50}$) of 500 nm to 20 µm. The first inorganic filler and the second inorganic filler are uniformly dispersed in the insulating resin layer. This is because when the two inorganic fillers having different particle diameters are contained and are uniformly dispersed, it is possible to inhibit elution of copper ions from the copper foil layer, and to prevent electrochemical migration from occurring.

Here, the average particle diameter ($D_{50}$) refers to an average particle diameter obtained by measurement with a laser diffraction-type particle size distribution measuring apparatus. In addition, the upper limit value and the lower limit value of the particle diameters can be derived from the measurement results with the same particle size distribution measuring apparatus.

Since the insulating resin layer of the metal-base printed circuit board is required to dissipate heat in the copper foil layer to the metal base plate, the insulating resin layer also must have heat resistance. It is difficult to use a thermoplastic resin for the insulating resin layer, and it is preferable to use a thermosetting resin for the insulating resin layer. As the thermosetting resin, it is possible to use, for example, an epoxy resin, a phenolic resin, a urea resin, an unsaturated polyester resin, an allyl resin, a thermosetting polyimide resin, a bismaleimide-triazine resin, or a thermally curable modified polyphenylene ether-based resin.

The resin used for the insulating resin layer is preferably an epoxy resin. Epoxy resins are particularly preferable among thermosetting resins, because epoxy resins are excellent in terms of not only costs, but also adhesion to metals such as the copper foil layer and the metal base plate, and also because inorganic fillers can be easily dispersed in epoxy resins.

As a main agent of the epoxy resin, a liquid epoxy resin is preferably used, because inorganic fillers can be easily dispersed in a liquid epoxy resin. The glass transition temperature (Tg) of the epoxy resin is preferably 100° C. to 250° C. The main agent is not particularly limited, and it is possible to use, for example, one of, or a combination of, bisphenol A type epoxy resins, bisphenol F type epoxy resins, bisphenol S type epoxy resins, cresol novolac type epoxy resins, phenol novolac type epoxy resins, alkylphenol novolac type epoxy resins, aralkyl type epoxy resins, naphthalene type epoxy resins, dicyclopentadiene type epoxy resins, and the like.

For such an epoxy resin, a curing agent is used. The curing agent is not particularly limited, and it is possible to use, for example, one of, or a combination of, amine-based curing agents, guanidine-based curing agents, imidazole-based curing agents, triazine skeleton-containing phenol-based curing agents, phenol-based curing agents, triazine skeleton-containing naphthol-based curing agents, naphthol-based curing agents, acid anhydride-based curing agents, active ester-based curing agents, benzoxazine-based curing agents, cyanate ester resins, and the like.

If necessary, it is possible to add a curing accelerator in order to control the curing reaction of the epoxy resin. As the curing accelerator, it is possible to use, for example, an imidazole such as 2-ethyl-4-methylimidazole; a tertiary amine such as benzyldimethylamine; an aromatic phosphine such as triphenylphosphine; a Lewis acid such as boron trifluoride monoethylamine; a boric acid ester; or the like, but the curing accelerator is not limited thereto.

The ratio of the curing agent blended can be determined based on the epoxy equivalent weight of the epoxy resin main agent and the amine equivalent weight or acid anhydride equivalent weight of the curing agent. In addition, when the curing accelerator is used, the ratio of the curing accelerator blended is preferably 0.1% by mass to 5% by mass, in which the mass of the epoxy resin main agent is taken as 100%.

The content of the first inorganic filler in the insulating resin layer is preferably 1% by mass to 10% by mass. If the content is less than 1% by mass, it is difficult to inhibit the elution of copper ions. Meanwhile, if the content is more than 10% by mass, the effect of preventing the elution of copper ions is not improved further. Moreover, the insulating properties deteriorate because of aggregation of the filler, and it tends to be difficult for the insulating resin layer to contain a sufficient amount of the second inorganic filler, which has high thermal conductivity. Considering the effect of preventing the elution of copper ions and the thermal conductivity of the insulating resin layer, the content of the first inorganic filler is more preferably 1% by mass to 7% by mass.

The content of the second inorganic filler in the insulating resin layer is preferably 1% by mass to 95% by mass. If the content is less than 1% by mass, the insulating resin layer cannot provide a sufficient heat dissipation effect. Meanwhile, if the content exceeds 95% by mass, it tends to be difficult for the insulating resin layer to contain a sufficient amount of the first inorganic filler, and the effect of preventing the elution of copper ions decreases. Moreover, the decrease in the ratio of the resin also causes decrease in mechanical strength. Considering the effect of preventing the elution of copper ions and the thermal conductivity of the insulating resin layer, the content of the second inorganic filler is more preferably 30% by mass to 80% by mass.

The first inorganic filler is preferably inorganic particles made of any one of, or any combination of, $SiO_2$, $TiO_2$, MgO, $Al_2O_3$, BN, and AlN. This is not only because such an inorganic filler is capable of effectively preventing the elution of copper ions, but also because when the insulating resin layer is prepared by using such an inorganic filler, the inorganic filler does not reduce the thermal conductivity, and therefore does not impair the heat dissipation effect.

The second inorganic filler is preferably inorganic particles made of any one of, or any combination of, $Al_2O_3$, BN, AlN, and $SiO_2$. This is because such an inorganic filler has high thermal conductivity, and therefore can improve the heat dissipation effect, when the insulating resin layer is prepared by using the inorganic filler.

Next, the metal-base printed circuit board of the present invention is described in terms of a manufacturing method by showing a mode of the manufacturing method as an example. FIG. 1 is a cross-sectional view for illustrating a structure of a metal-base printed circuit board according to an embodiment of the present invention. A metal-base printed circuit board 100 has a structure in which an insulating resin layer 102 and a copper foil layer 101 are stacked, in this order, on a metal base plate 103.

The insulating resin layer 102 is obtained as follows. Specifically, a prepreg is prepared by applying a dispersion (hereinafter, also referred to as insulating resin layer composition) of the first inorganic filler, the second inorganic filler, and the like in the epoxy resin or the like to a copper foil layer 101, a PET (polyethylene terephthalate) film, or the like, and one to several sheets of the prepreg are stacked on one the other. The insulating resin layer 102 is placed on the metal base plate 103, and a copper foil layer 101 is further stacked thereon. Then, these are bonded together by hot pressing to form the metal-base printed circuit board 100. The copper foil layer 101 can be etched to have any wiring pattern.

Note that the present invention can be applied not only to the metal-base printed circuit board shown as an example in FIG. 1, but also to any printed circuit board having a form not departing from the gist of the present invention. Moreover, the present invention can also be applied to resins for sealing.

Next, a mode of a method for producing the insulating resin layer composition is described. However, the present invention is not limited to this mode.

For the insulating resin layer composition, the first inorganic filler having the smaller particle diameter is first added to, for example, the above-described epoxy resin main agent with stirring, and then the second inorganic filler having the larger particle diameter is added thereto with stirring. After the absence of any coarse particles is visually confirmed, the first inorganic filler and the second inorganic filler can be dispersed by using a commercially available pulverization machine, powder mixing machine, or ultrafine particle composing machine. For example, a planetary centrifugal mixer manufactured by THINKY, NANOMIZER (a medialess, high-pressure and wet-type pulverization machine) manufactured by NANOMIZER Inc., Nobilta or Nanocular manufactured by Hosokawa Micron Corporation, or the like can be used, but the machine is not limited thereto. Regarding the processing conditions in a case of using the NANOMIZER, the dispersing can be achieved by repeating a process conducted under a processing pressure of 100 MPa to 150 MPa for 5 minutes to 10 minutes two to five times. Meanwhile, regarding the conditions in a case of using a planetary centrifugal mixer, the dispersing can be achieved by repeating a process conducted at a rotation speed of 1000 rpm to 2000 rpm for 1 minute to 3 minutes two to five times. Note that it is possible to change, as appropriate, the processing pressure and the processing time.

After the inorganic fillers are dispersed in the epoxy resin main agent, the curing agent and the curing accelerator are mixed with this resin mixture. Thus, an insulating resin layer composition is obtained. To the insulating resin layer composition, a dispersing agent, an anti-foaming agent, a leveling agent, and the like can be added, as appropriate, considering the dispersibility of the inorganic fillers, elimination of bubbles formed during the dispersing, the smoothness of the resultant prepreg, and the like.

A prepreg can be produced by a method in which the insulating resin layer composition is heated by being sprayed with hot air onto a copper foil layer, a PET film, or the like or by other means, and thus is dried to a semi-cured state. To facilitate the spraying or the like, the insulating resin layer composition can also be prepared in the form of a varnish slurry by diluting the insulating resin layer composition with a solvent such as methyl ethyl ketone (MEK).

EXAMPLES

Hereinafter, the present invention will be described in further detail on the basis of Examples and Comparative Examples. However, the following Examples do not limit the present invention.

1. Preparation of Insulating Resin Layer Compositions

Production Example 1

To 20 g of a bisphenol A epoxy resin main agent (Mitsubishi Chemical Corporation, 816B), 0.8 g of silica nanoparticles (AEROSIL A200, average particle diameter: 7 nm, particle diameters: 1 nm to 300 nm) were added with stirring, and then 40 g of an alumina micro filler (Admatechs AO-802, average particle diameter: 0.7 μm, particle diameters: 0.1 nm to 5 μm) was added with stirring. After the absence of coarse particles was visually confirmed, the silica nanoparticles and the alumina micro filler were dispersed by using a planetary centrifugal mixer (manufactured by THINKY). A dispersing process at a rotation speed of 2000 rpm was repeated five times for 2 minutes each. After the dispersing, 6 g of an amine-based curing agent, 4,4'-methylenebis(2-methylcyclohexanamine) (Mitsubishi Chemical Corporation, 113), was mixed with this resin mixture with manual stirring.

Production Example 2

An insulating resin layer composition was prepared in the same manner as in Production Example 1, except that, instead of the silica nanoparticles, 0.8 g of titania nanoparticles (Fuji Titanium Industry Co., Ltd., TAF-500, average particle diameter: 50 nm, particle diameters: 1 nm to 100 nm) were added with stirring.

2. Fabrication of Metal-Base Printed Circuit Boards

The insulating resin layer composition prepared in Production Example 1 was applied onto a copper foil (12 cm in length, 12 cm in width, and about 10 to 35 μm in thickness) to a film thickness of 100 μm. Then, the insulating resin layer composition was preliminarily cured by heating in a thermostatic chamber at 70° C. for 3 hours, and secondarily cured by further heating at 120° C. for 3 hours. After that, the copper foil was cut into a size of 4 cm in length and 4 cm in width, and an area on the copper foil surface was masked with a pressure-sensitive tape having a diameter of 1 cm. Then, the copper foil in the area other than the masked area was removed by etching. Thus, sample 1 was prepared. Sample 2 was prepared in the same manner by using the insulating resin layer composition prepared in Production Example 2.

3. Evaluation of Copper Ion Elution Prevention Performance

By using sample 1 and sample 2, whether or not copper ions were eluted was evaluated by measuring the space charge of each sample using a PEA space charge measurement system (a charge distribution measuring apparatus manufactured by Five Lab Co., Ltd.). The principle on which the PEA system is based is that a sample is placed between electrodes, a pulsed voltage is applied to the sample to oscillate the internal charges, and the oscillation pressure waves are detected with a sensor. The sample was set to the PEA space charge measurement system, with the insulating resin layer surface of the sample being in contact with the aluminum cathode of the PEA space charge measurement system and the copper foil surface of the sample being in contact with the anode of the PEA space charge measurement system. Then, an electric field of 5 kV/mm was applied for 10 hours under conditions of a temperature of 85° C. and a humidity of 85%. The sample was taken out of a constant temperature and humidity chamber before the application of the electric field, as well as 2 hours, 4 hours, 6 hours, 8 hours, and 10 hours after the start of the application of the electric field, and the space charge distribution in the sample was measured, while a voltage by which an average electric field of 5 kV/mm was applied to the sample was being applied. In this test, the aluminum cathode was equivalent to the metal base plate, and the copper foil in contact with the anode served as an anode. This experiment conducted by using sample 1 is referred to as Example 1, and this experiment conducted by sample 2 is referred to as Example 2.

Figure 2A:
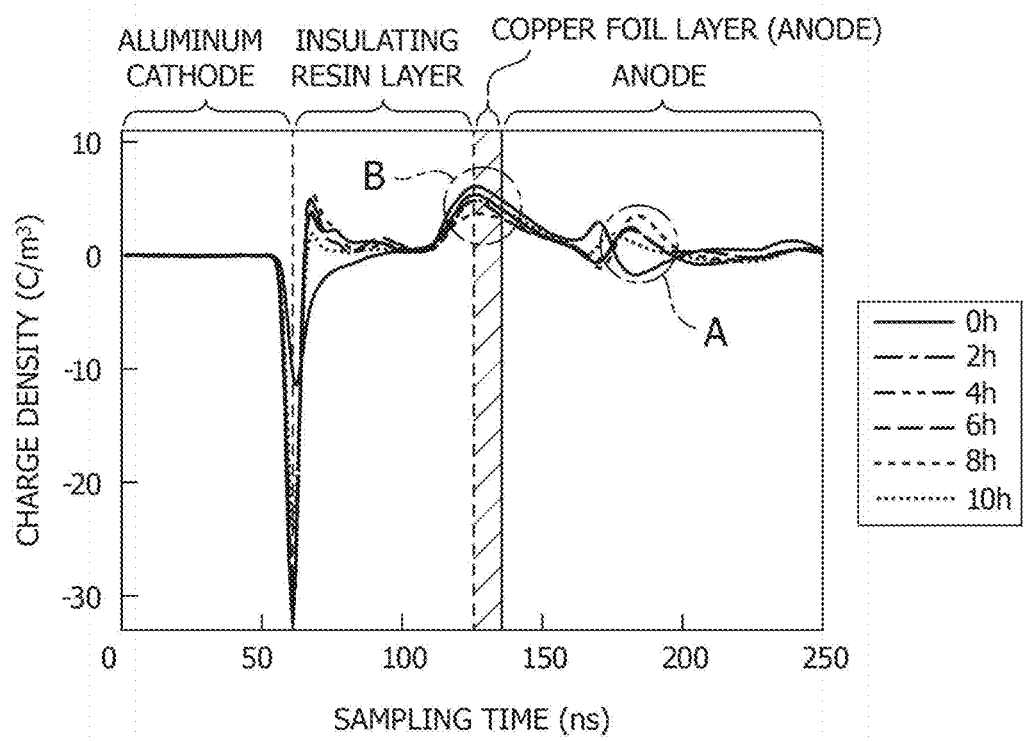
FIGS. 2A and 2B show graphs of measurement results of the space charge distribution in metal-base printed circuit boards according to the present invention.

FIG. 2A is a graph showing the measurement results of the space charge distribution of Example 1. The vertical axis represents the charge density, and the horizontal axis represents the sampling time. In the graph, two portions in which the charge density greatly changed are indicated by dotted lines. Such a great change in charge density is a phenomenon observed at a boundary between layers or because of reflection of charges. The dotted line on the left is the boundary between the aluminum cathode and the insulating resin layer, and the dotted line on the right represents the boundary between the insulating resin layer and the copper foil layer. Note that each peak indicated by A represents a signal due to reflection by the copper foil layer, and is not due to the charge in density, which is observed at a boundary of layers. The left side region of the dotted line on the left is the aluminum cathode plate, and the hatched region extending from the dotted line on the right to the right by 10 ns is the copper foil layer. The right side region of the copper foil layer is the anode plate, and the region between the dotted lines is the insulating resin layer.

If copper ions are eluted from the copper foil layer to the insulating resin layer, a phenomenon is observed in which the peak indicated by B present at the boundary between the copper foil layer and the insulating resin layer shifts toward the insulating resin layer. In FIG. 2A, the peak indicated by B did not shift toward the insulating resin layer in all of the cases before the test and 2 hours to 10 hours after the start of the application of the electric field. In other words, elution of copper ions was not observed in Example 1.

Figure 2B:
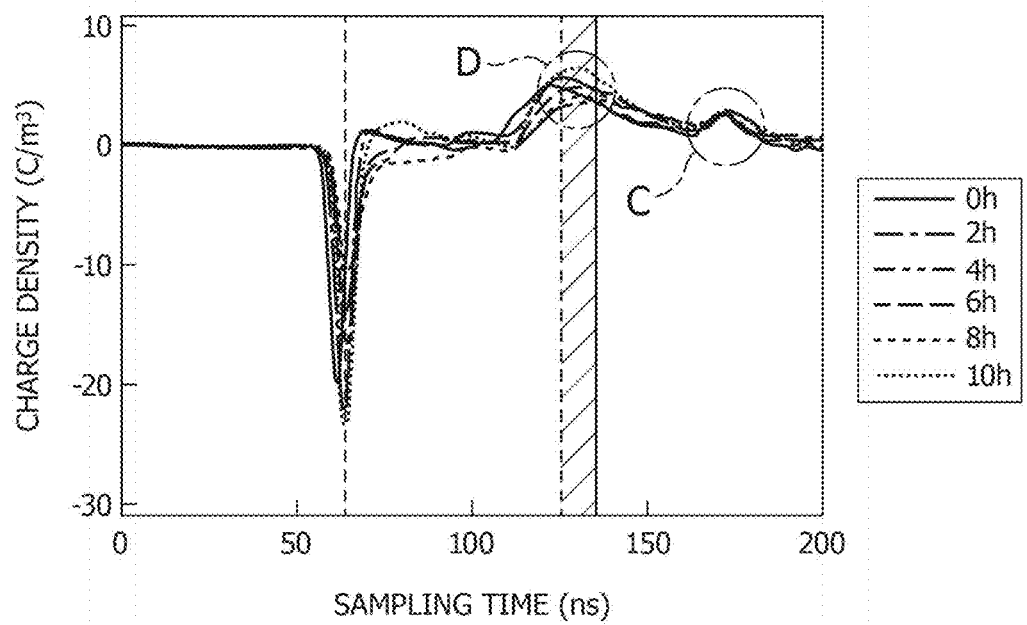

FIG. 2B is a graph showing the measurement results of the space charge distribution of Example 2. Each peak indicated by C represents a signal due to reflection by the copper foil layer. Also in the measurement results, the peak indicated by D present at the boundary between the copper foil layer and the insulating resin layer did not shift toward the insulating resin layer. In other words, elution of copper ions was also not observed in Example 2.

Figure 3A:
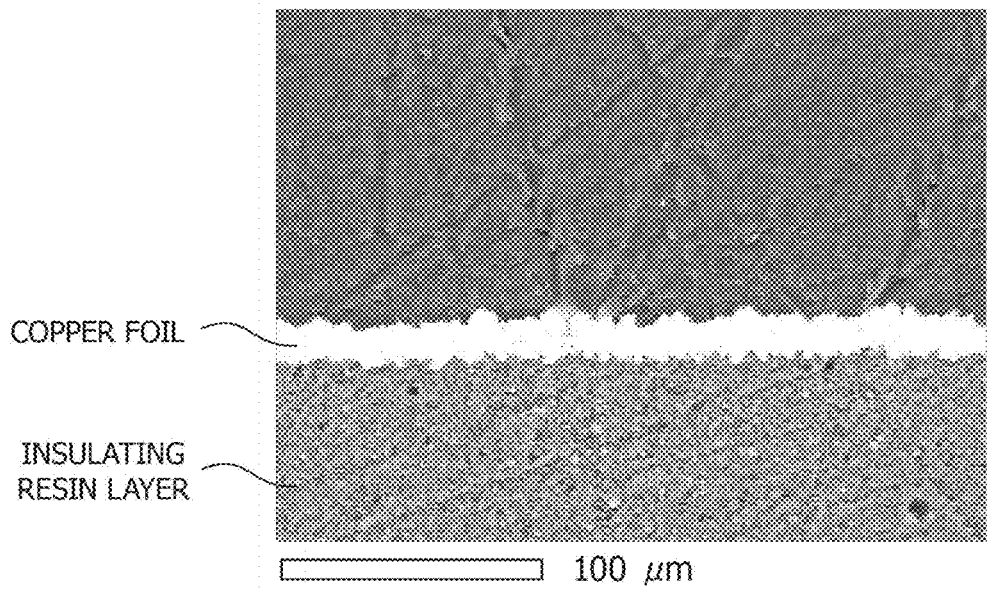
FIGS. 3A and 3B show cross-sectional images of a metal-base printed circuit board of Example 1, 10 hours after start of application of an electric field.
Figure 3B:
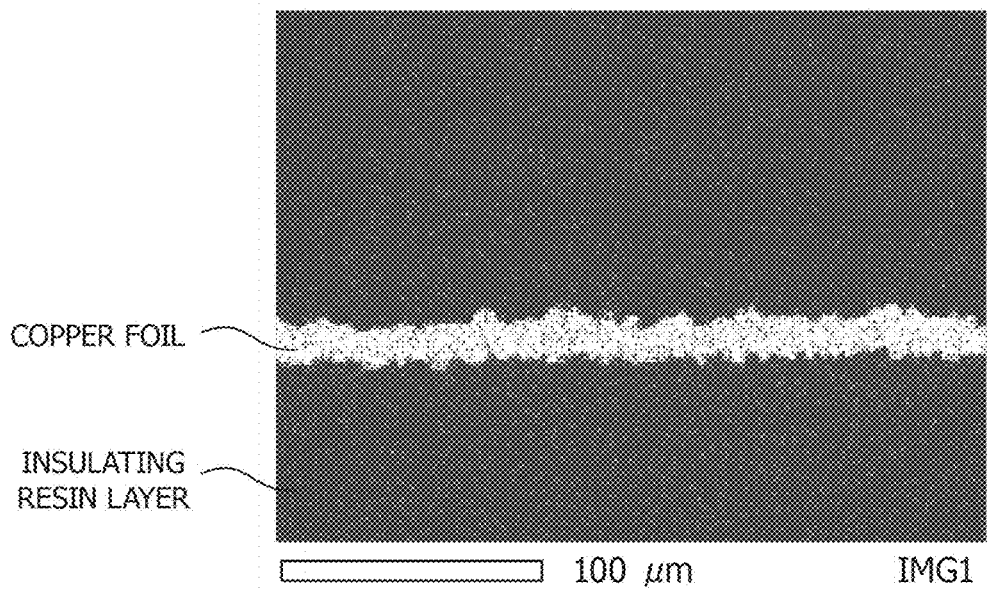

FIGS. 3A and 3B show cross-sectional images of sample 1 subjected to the application of the electric field for 10 hours in Example 1 described above. FIG. 3A is a cross-sectional image taken by SEM. In FIG. 3A, the white layer is the copper foil layer, and the layer under the copper foil layer is the insulating resin layer. Meanwhile, FIG. 3B shows a measurement result of the distribution of copper element by energy-dispersive X-ray spectroscopy (EDS). In FIG. 3B, the white layer is the copper foil layer, and the layer under the copper foil layer is the insulating resin layer. In each of FIG. 3A and FIG. 3B, elution of copper ions was not observed, and the metal-base printed circuit board was found to be excellent in electrochemical migration resistance.

Figure 4A:
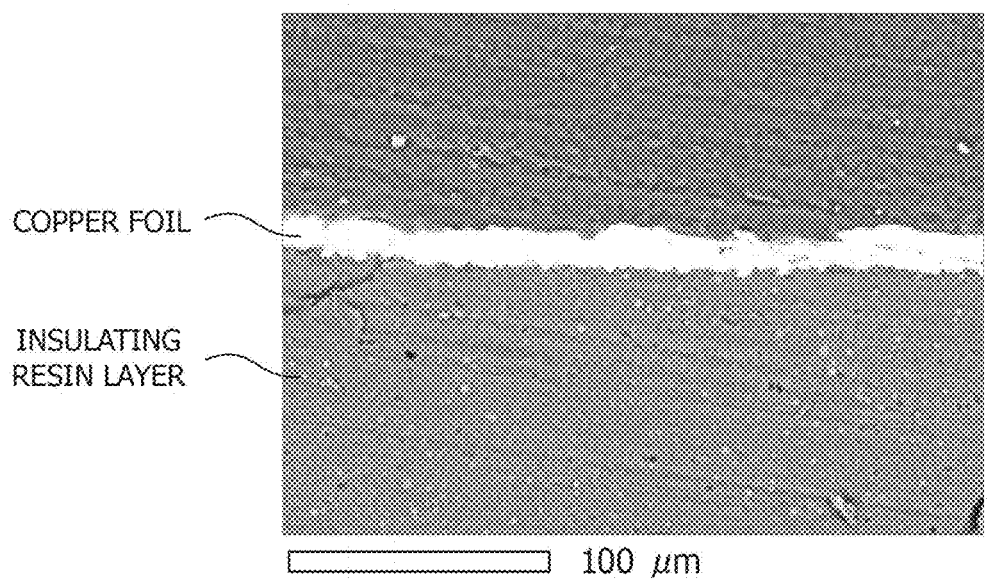
FIGS. 4A and 4B show cross-sectional images of a metal-base printed circuit board of Example 2, 10 hours after start of application of an electric field.
Figure 4B:
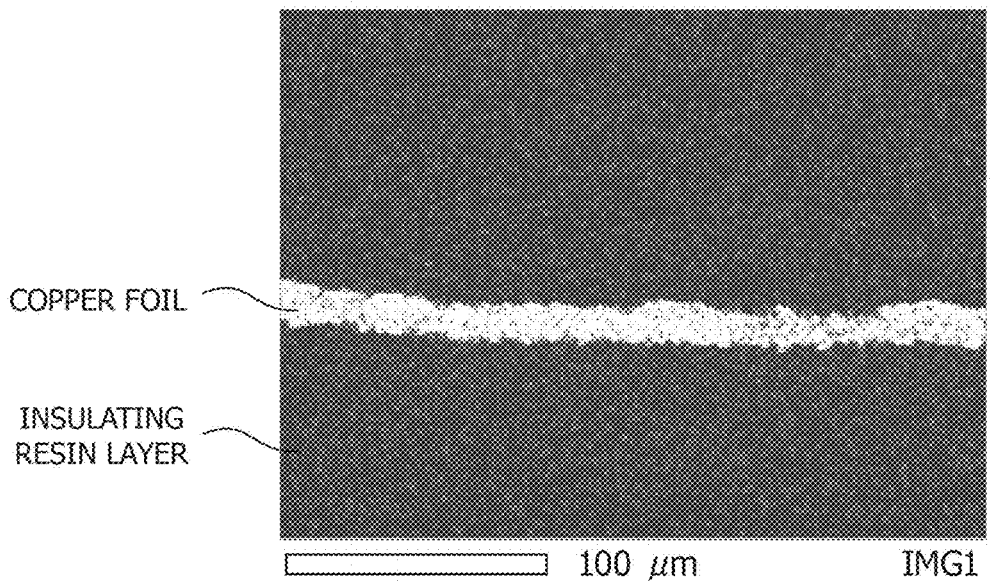

FIGS. 4A and 4B show cross-sectional images of sample 2 subjected to the application of the electric field for 10 hours in Example 2 described above. FIG. 4A is a cross-sectional image taken by SEM in the same manner as in the case of FIGS. 3A and 3B. Meanwhile, FIG. 4B is a measurement result of the distribution of copper element by energy-dispersive X-ray spectroscopy (EDS). In each of FIG. 4A and FIG. 4B, elution of copper ions was not observed, and the metal-base printed circuit board was found to be excellent in electrochemical migration resistance.

INDUSTRIAL APPLICABILITY

The present invention is industrially useful because the present invention makes it possible to provide a metal-base printed circuit board in which electrochemical migration can be prevented from occurring.

REFERENCE SIGNS LIST 100 metal-base printed circuit board
101 copper foil 102 insulating resin layer
103 metal base plate

The invention claimed is:
1. A metal-base printed circuit board comprising:
a metal base plate having an insulating resin layer and a copper foil layer stacked thereon, in this order, wherein:
the insulating resin layer comprises a resin, a first inorganic filler made of inorganic particles having an average particle diameter ($D_{50}$) of 1 nm to 50 nm, and a second inorganic filler made of inorganic particles having an average particle diameter ($D_{50}$) of 500 nm to 20 μm, and
the first inorganic filler and the second inorganic filler are each uniformly dispersed in the insulating resin layer, the first inorganic filler being dispersed into the insulating resin layer separately from the second inorganic filler, wherein the content of the first inorganic filler in the insulating resin layer is 1% by mass to 7% by mass, and the first inorganic filler is selected from materials being capable of effectively preventing the elution of copper ions.

2. The metal-base printed circuit board according to claim 1, wherein the resin used for the insulating resin layer is an epoxy resin.

3. The metal-base printed circuit board according to claim 1, wherein the content of the second inorganic filler in the insulating resin layer is 1% by mass to 95% by mass.

4. The metal-base printed circuit board according to claim 1, wherein the second inorganic filler is inorganic particles made of any one of, or any combination of, $Al_2O_3$, BN, AlN, and $SiO_2$.

5. The metal-base printed circuit board according to claim 2, wherein the content of the second inorganic filler in the insulating resin layer is 1% by mass to 95% by mass.

6. The metal-base printed circuit board according to claim 2, wherein the second inorganic filler is inorganic particles made of any one of, or any combination of, $Al_2O_3$, BN, AlN, and $SiO_2$.

7. The metal-base printed circuit board according to claim 1, wherein the metal-base printed circuit board is a single-sided printed circuit board, and the insulating resin layer consists of a single layer.

8. The metal-base printed circuit board according to claim 2, wherein the metal-base printed circuit board is a single-sided printed circuit board, and the insulating resin layer consists of a single layer.

9. The metal-base printed circuit board according to claim 2, wherein the epoxy resin comprises an amine-based curing agent.

10. The metal-base printed circuit board according to claim 1, wherein the filler contained in the insulating resin layer consists of the first inorganic filler and the second inorganic filler.

11. The metal-base printed circuit board according to claim 2, wherein the filler contained in the insulating resin layer consists of the first inorganic filler and the second inorganic filler.

12. A metal-base printed circuit board comprising:
a metal base plate having an insulating resin layer and a copper foil layer stacked thereon, in this order, wherein:
the insulating resin layer comprises a resin, a first inorganic filler made of inorganic particles having an average particle diameter ($D_{50}$) of 1 nm to 300 nm, and a second inorganic filler made of inorganic particles having an average particle diameter ($D_{50}$) of 500 nm to 20 μm, and
the first inorganic filler and the second inorganic filler are each uniformly dispersed in the insulating resin layer, the first inorganic filler being dispersed into the insulating resin layer separately from the second inorganic filler, wherein the content of the first inorganic filler in the insulating resin layer is 1% by mass to 7% by mass, and the content of the second inorganic filler in the insulating resin layer is 50% to 95% by mass, and the first inorganic filler is selected from materials being capable of effectively preventing the elution of copper ions.

13. The metal-base printed circuit board according to claim 12, wherein the resin used for the insulating resin layer is an epoxy resin.

14. The metal-base printed circuit board according to claim 12, wherein the second inorganic filler is inorganic particles made of any one of, or any combination of, $Al_2O_3$, BN, AlN, and $SiO_2$.

15. The metal-base printed circuit board according to claim 12, wherein the metal-base printed circuit board is a single-sided printed circuit board, and the insulating resin layer consists of a single layer.

16. A metal-base printed circuit board comprising:
a metal base plate having an insulating resin layer and a copper foil layer stacked thereon, in this order, wherein:
the insulating resin layer comprises a resin, a first inorganic filler made of inorganic particles having an average particle diameter ($D_{50}$) of 1 nm to 300 nm, and a second inorganic filler made of inorganic particles having an average particle diameter ($D_{50}$) of 1.5 μm to 20 μm, and
the first inorganic filler and the second inorganic filler are each uniformly dispersed in the insulating resin layer, the first inorganic filler being dispersed into the insulating resin layer separately from the second inorganic filler, wherein the content of the first inorganic filler in the insulating resin layer is 1% by mass to 7% by mass, and the first inorganic filler is selected from materials being capable of effectively preventing the elution of copper ions.

17. The metal-base printed circuit board according to claim 16, wherein the resin used for the insulating resin layer is an epoxy resin.

18. The metal-base printed circuit board according to claim 16, wherein the content of the second inorganic filler in the insulating resin layer is 1% by mass to 95% by mass.

19. The metal-base printed circuit board according to claim 16, wherein the second inorganic filler is inorganic particles made of any one of, or any combination of, $Al_2O_3$, BN, AlN, and $SiO_2$.

20. The metal-base printed circuit board according to claim 16, wherein the metal-base printed circuit board is a single-sided printed circuit board, and the insulating resin layer consists of a single layer.

* * * * *